(12) United States Patent
Lee et al.

(10) Patent No.: US 12,219,722 B2
(45) Date of Patent: Feb. 4, 2025

(54) CASING WITH REPLACEMENT STRUCTURE AND ELECTRONIC DEVICE

(71) Applicant: Getac Technology Corporation, New Taipei (TW)

(72) Inventors: Kun-Cheng Lee, Taipei (TW); Juei-Chi Chang, Taipei (TW); Hsin-Chih Chou, Taipei (TW)

(73) Assignee: Getac Technology Corporation, New Taipei (TW)

( * ) Notice: Subject to any disclaimer, the term of this patent is extended or adjusted under 35 U.S.C. 154(b) by 224 days.

(21) Appl. No.: 17/980,644

(22) Filed: Nov. 4, 2022

(65) Prior Publication Data

US 2023/0262909 A1   Aug. 17, 2023

Related U.S. Application Data

(60) Provisional application No. 63/309,124, filed on Feb. 11, 2022.

(30) Foreign Application Priority Data

Sep. 8, 2022 (CN) .......................... 202211093933.0

(51) Int. Cl.
*H05K 5/02* (2006.01)
*G06F 1/16* (2006.01)
*H05K 5/03* (2006.01)

(52) U.S. Cl.
CPC ......... *H05K 5/0221* (2013.01); *G06F 1/1632* (2013.01); *H05K 5/03* (2013.01)

(58) Field of Classification Search
CPC ...... H05K 5/0221; H05K 5/03; H05K 5/0017; H05K 5/0217; G06F 1/1632; G06F 1/184–185

USPC ......................................................... 361/752
See application file for complete search history.

(56) References Cited

U.S. PATENT DOCUMENTS

| | | |
|---|---|---|
| 5,132,876 A | 7/1992 | Ma |
| 5,784,253 A | 7/1998 | Ooka et al. |
| 6,108,199 A | 8/2000 | Bonardi et al. |
| 11,092,996 B2 | 8/2021 | Lee et al. |
| 11,099,614 B1 | 8/2021 | Kuo |
| 2004/0125554 A1* | 7/2004 | DeLuga ................ G06F 1/1635 361/679.58 |
| 2005/0041384 A1 | 2/2005 | Lo |

(Continued)

FOREIGN PATENT DOCUMENTS

| | | |
|---|---|---|
| TW | M401290 U | 4/2011 |
| TW | 201115305 A | 5/2011 |
| TW | 201928570 A | 7/2019 |

OTHER PUBLICATIONS

Taiwan Patent Office, "Office Action", Mar. 13, 2023, Taiwan.
European Search Report, Jul. 21, 2023, Germany.

*Primary Examiner* — Hung S. Bui
(74) *Attorney, Agent, or Firm* — Locke Lord LLP; Tim Tingkang Xia, Esq.

(57) ABSTRACT

A casing with a replacement structure includes the casing and a replacement assembly. The casing includes a casing body and an assembly space. The assembly space is provided in a recessed manner at the casing body and is located at a vertical intersection of two side edges of the casing body. The replacement assembly includes a frame, which is installed in the assembly space and encloses with the casing body to form an accommodating space.

16 Claims, 8 Drawing Sheets

(56) References Cited

U.S. PATENT DOCUMENTS

| | | | |
|---|---|---|---|
| 2006/0018087 A1* | 1/2006 | Mizuno | G11B 33/124 |
| | | | 361/679.02 |
| 2013/0088831 A1 | 4/2013 | Zheng et al. | |
| 2015/0003005 A1* | 1/2015 | Chen | G06F 1/187 |
| | | | 361/679.33 |
| 2016/0073545 A1* | 3/2016 | Cravens | G06F 1/20 |
| | | | 29/592.1 |
| 2021/0092858 A1* | 3/2021 | Chou | F16C 11/04 |

\* cited by examiner

CASING WITH REPLACEMENT STRUCTURE AND ELECTRONIC DEVICE

CROSS-REFERENCE TO RELATED APPLICATIONS

The application claims the benefit of a U.S. Provisional Patent Application No. 63/309,124, filed on Feb. 11, 2022, the disclosure of which is hereby incorporated by reference herein in its entirety. The application further claims priority to a Chinese Patent Application No. 2022110939330, filed on Sep. 8, 2022, the disclosure of which is also hereby incorporated by reference herein in its entirety.

BACKGROUND OF THE INVENTION

Field of the Invention

The present application relates to a casing, and more particular to a casing with a replacement structure and an electronic device having the casing with a replacement structure.

Description of the Prior Art

A conventional electronic device is usually provided with an optical disk drive. However, the position occupied by the optical disk drive cannot be used by a function expansion component or be replaced by other function components, causing limited functions of the electronic device and failing to provide customers with more diversified options.

SUMMARY OF THE INVENTION

In view of the above, a casing with a replacement structure provided according to an embodiment includes the casing and a replacement assembly. The casing includes a casing body and an assembly space. The assembly space is provided in a recessed manner at the casing body and is located at a vertical intersection of two side edges of the casing body. The replacement assembly includes a frame, which is installed in the assembly space and encloses with the casing body to form an accommodating space.

In some embodiments, the frame is installed in the assembly space, and the frame at least substitutes for the two vertically intersecting side edges of the casing.

In some embodiments, the replacement assembly includes an expansion device, which is installed in the accommodating space.

In some embodiments, the frame has an opening portion, which is provided to face an outer side of the frame.

In some embodiments, the frame includes a first hole, and the expansion device includes a bracket and an expansion member. The expansion member is installed on the bracket. The bracket includes a second hole, and first hole corresponds to the second hole. The frame and the bracket are mutually fixed by a fixing member.

In some embodiments, the bracket further includes a lever.

In some embodiments, a cover plate is included. The cover plate is installed on the replacement assembly and covers the accommodating space.

In some embodiments, the casing body has a connection portion, and the frame has an opening portion, wherein the opening portion is provided to face the connection portion. The expansion device is electrically connected to the connection portion via the opening portion.

In some embodiments, a waterproof member protruding from the opening portion is included.

In some embodiments, the frame includes a latch assembly. The latch assembly has a toggle lever and an engagement portion. The toggle lever is connected to the engagement portion so as to move the engagement portion between a lock position and a release position by the toggle lever.

An electronic device further provided according to another embodiment includes a casing and a replacement assembly. The casing includes a casing body and an assembly space. The assembly space is provided in a recessed manner at the casing body and is located at a vertical intersection of two side edges of the casing body. The replacement assembly includes a frame, which is installed in the assembly space and encloses with the casing body to form an accommodating space.

An electronic device further provided according to another embodiment includes a casing and a replacement assembly. The casing includes a casing body and an assembly space. The assembly space is provided in a recessed manner on a corner of the casing body. The replacement assembly includes a frame and an expansion device. The frame is installed in the assembly space and encloses with the casing body to form an accommodating space. The expansion device is installed in the accommodating space.

In conclusion, a casing with a replacement structure and an electronic device are provided according to the embodiments above. By providing the assembly space for installing the replacement assembly at a vertical intersection of two side edges of the casing body, occupying the space of the electronic device is avoided. Moreover, by substituting the frame of the replacement assembly for part of the casing body, the material used by the casing body can be reduced, and the casing body is allowed to be more intact as having a reduced number of holes. In addition, because the assembly space is completely exposed and visible, the replacement assembly can be more easily aligned and installed during the assembly process. Moreover, the replacement assembly is selectively removable from the assembly space, further achieving an effect of quick replacement.

DETAILED DESCRIPTION OF THE EMBODIMENTS

Figure 1:
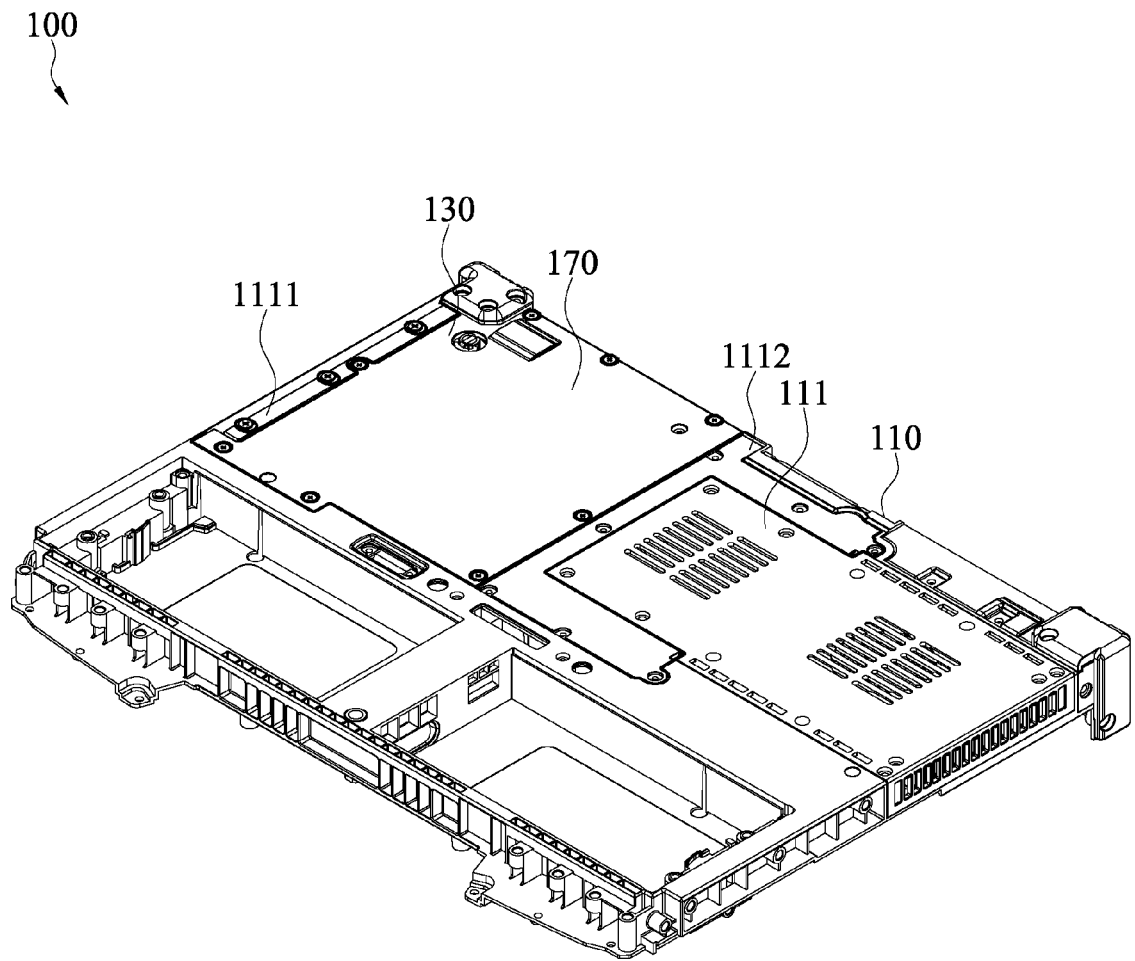
FIG. 1 is a perspective schematic diagram of a casing with a replacement structure according to a first embodiment.
Figure 2:
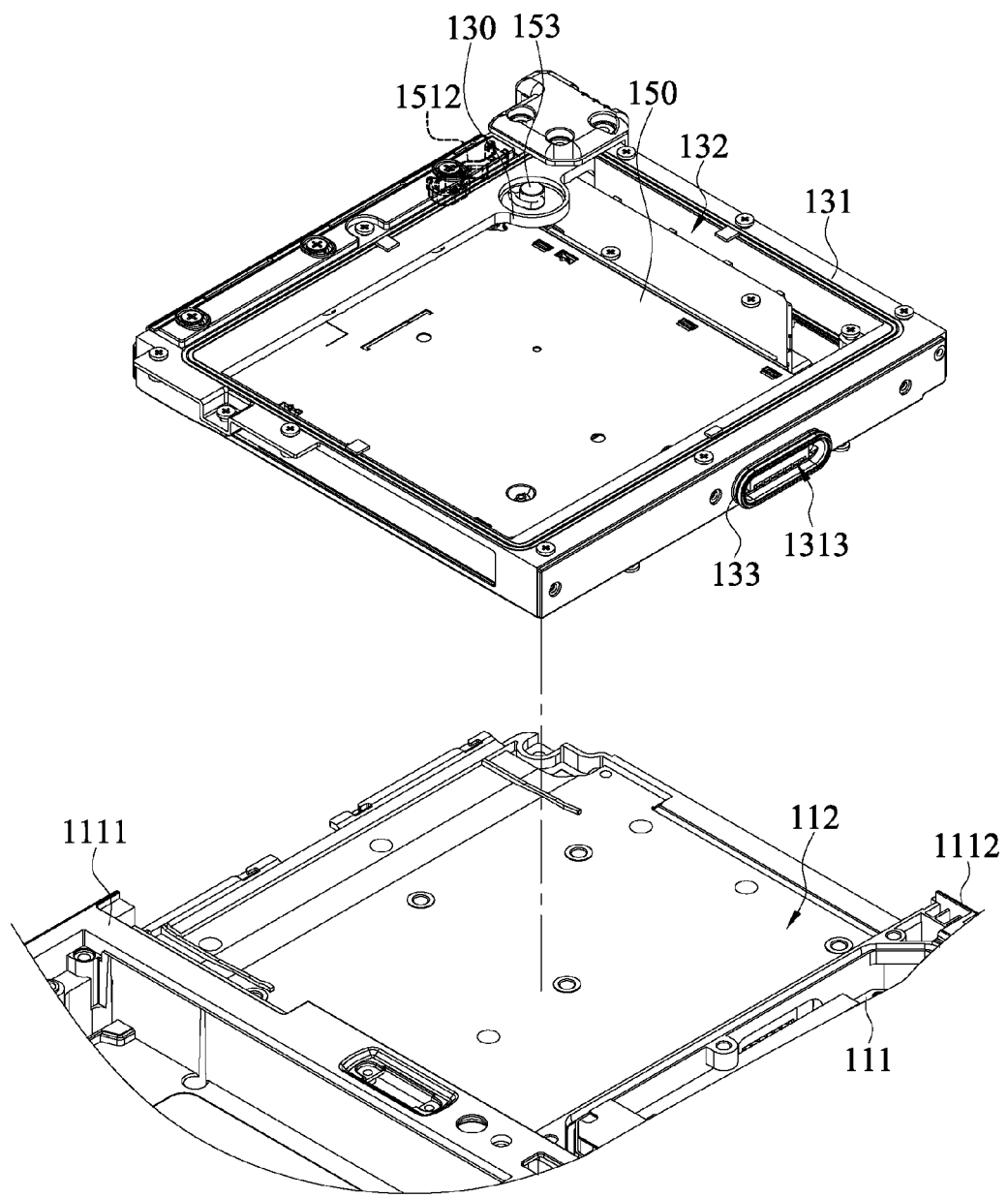
FIG. 2 is an exploded partial perspective diagram of a casing with a replacement structure according to the first embodiment.

Refer to FIG. 1 to FIG. 2. FIG. 1 shows a perspective schematic diagram of a casing with a replacement structure according to a first embodiment. FIG. 2 shows an exploded partial perspective diagram of a casing with a replacement structure according to the first embodiment. A casing 100 with a replacement structure of this embodiment includes a casing 110 and a replacement assembly 130. The casing 100 with a replacement structure is applied to an electronic device, which is, for example, a laptop computer, a keyboard dock or an office dock. For example, the casing 100 with a replacement structure serves as a casing of a laptop computer, and is selectively removable from an electronic device through the replacement assembly 130, so as to achieve effects of quickly replacement of function components and adaptability to different function components according to requirements.

The casing 110 includes a casing body 111 and an assembly space 112. The assembly space 112 is provided in a recessed manner at the casing body 111 and is located at a vertical intersection of two side edges 1111 and 1112 of the casing body 111. In the first embodiment, the assembly space 112 is located at the intersection of the two side edges 1111 and 1112 of the casing body 111, that is, a corner of the casing 110, so that configurations of other peripheral components are less likely affected because the assembly space 112 is located on the corner. As shown in FIG. 1, there is sufficient space of the use of other peripheral components in each of the directions of the side edges 1111 and 1112.

As shown in FIG. 2, the replacement assembly 130 includes a frame 131, which is installed in the assembly space 112 and encloses with the casing body 111 to form an accommodating space 132. In the first embodiment, the replacement assembly 130 can be selectively removed from or installed to the casing 110 by means of, for example, screw locking. Moreover, the frame 131 of the replacement assembly 130 is installed in the assembly space 112 formed in a recessed manner from the casing body 111 so as to replace a recessed region of the casing body 111, and encloses with the casing body 111 to form the accommodating space 132. In the first embodiment, the accommodating space 132 is for installing an expansion device 150. The expansion device 150 is, for example, an optical drive assembly, a hard drive assembly or a battery assembly. The relation between the expansion device 150 and the replacement assembly 130 is to be described later.

Specifically, in the casing 100 with a replacement structure, the assembly space 112 for installing the replacement assembly 130 is provided at the vertical intersection between the two side edges 1111 and 1112 of the casing body 111, so as to avoid occupying the space of the other peripheral components. Moreover, by substituting the frame 131 of the replacement assembly 130 for part of the casing body 111, the material used by the casing body 111 can be reduced, and the casing body 1111 is allowed to be more intact as having a reduced number of holes. In addition, because the assembly space 112 is completely exposed and visible, the replacement assembly 130 can be more easily aligned and installed during the assembly process. Moreover, the replacement assembly 130 is selectively removable from the assembly space 112, further achieving an effect of quick replacement of function components. Thus, customers are provided with more diversified function options.

In the first embodiment, the frame 131 is installed in the assembly space 112, and the frame 131 at least substitutes for the two vertically intersecting side edges 1111 and 1112 of the casing 110. As shown in FIG. 1 and FIG. 2, due to the assembly space 112 formed in a recessed manner, at least a portion of each of the two side edges 1111 and 1112 of the casing 110 is also recessed. Thus, while substituting the frame 131 for the recessed region of the casing body 111, it at the same time substitutes for the two vertically intersecting side edges 1111 and 1112 of the casing 110.

Figure 3:
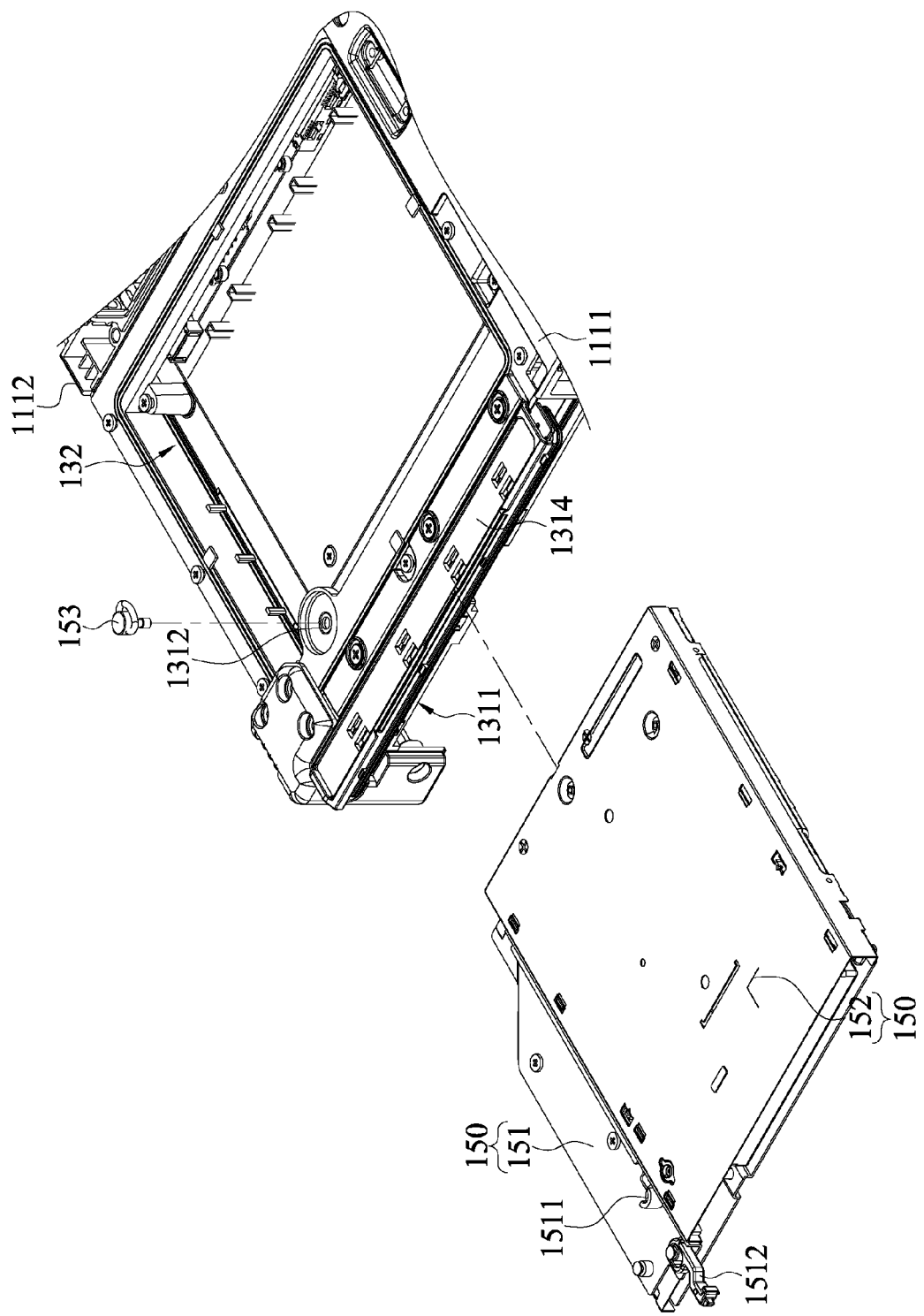
FIG. 3 is an operation schematic diagram of a replacement assembly according to the first embodiment.

Refer to FIG. 3 as well as FIG. 2. FIG. 3 shows an operation schematic diagram of a replacement assembly according to the first embodiment. In the first embodiment, the replacement assembly 130 includes an expansion device 150, which is installed in the accommodating space 132. In a first embodiment, the expansion device 150 is, for example, an optical drive assembly. In the first embodiment, the frame 131 has an opening portion 1311, which is provided to face an outer side of the frame 131. As shown in FIG. 3, the expansion device 150 can selectively enter or exit the accommodating space from the opening portion 1311. Moreover, the opening portion 1311 is, for example but not limited to, located the side edge 1111, or may be located at the side edge 1112. In the first embodiment, as shown in FIG. 3, the frame 131 includes a block plate 1314. The block plate 1314 corresponds to the opening portion 1311, is pivotally connected at the side edge 1111, and selectively opens or closes the opening portion 1311.

In this first embodiment, the frame 131 includes a first hole 1312, and the expansion device 150 includes a bracket 151 and an expansion member 152. The expansion member 152 is installed on the bracket 151, and the bracket 151 includes a second hole 1511. When the expansion device 150 is installed at the frame 131, the first hole 1312 corresponds to the second hole 1511, and the frame 131 and the bracket 151 are mutually fixed by a fixing member 153. As shown in FIG. 2 and FIG. 3, the fixing member 153 is, for example, a quick removal screw and is an independent element, which selectively passes through or is removed from the first hole 1312 and the second hole 1511, so as to achieve the function of releasing the fixing relation between the expansion device 150 and the frame 131. As shown in FIG. 2, when the expansion device 150 is located in the accommodating space 132, the first hole 1312 on the frame 131 corresponds to the second hole 1511 on the bracket 151, and the expansion device 150 is fixed on the frame 131 by passing the fixing member 153 through the first hole 1312 and the second hole 1511. As shown in FIG. 3, to remove the expansion device 150 from the accommodating space 132, the fixing member 132 is removed from the first hole 1312 and the second hole 1511, such that the fixing relation between the expansion device 150 and the frame 131 is released, thus allowing the expansion device 150 to be taken out of the opening portion 1311. Moreover, the fixing member 153 may also be an element on the frame 131. For example, the fixing member 153 is provided on the first hole 1312, for example, slidably arranged at the first hole 1312 or screw locked at the first hole 1312, allowing the quick removal screw to move relative to the second hole 1511. To remove the expansion device 150 from the accommodating space 132, the fixing member 132 is moved back to the first hole 1511, such that the fixing relation between the expansion device 150 and the frame 131 is released, thus allowing the expansion device 150 to be taken out of the opening portion 1311.

In the first embodiment, as shown in FIG. 2 and FIG. 3, the bracket 151 further includes a lever 1512. In the first embodiment, the lever 1512 is, for example, provided in an extendable manner at the bracket 151. To remove the expansion device 150 from the opening 1311, the lever 1512 is extended to protrude from the opening portion 1311, allowing a user to hold the lever 1512 and thus more conveniently take out the expansion device 150 from the opening portion 1311. Once the expansion device 150 is taken out, the lever 1512 can be retracted for storage. Moreover, the lever 1512 may also be pivotally connected on the bracket 151. To take out the expansion device 150 from the opening portion 1311, the lever 1512 is rotated to face the opening portion 1311, better allowing pulling by a user. Once the expansion device 150 is taken out, the lever 1512 can be rotated for storage.

Figure 4:
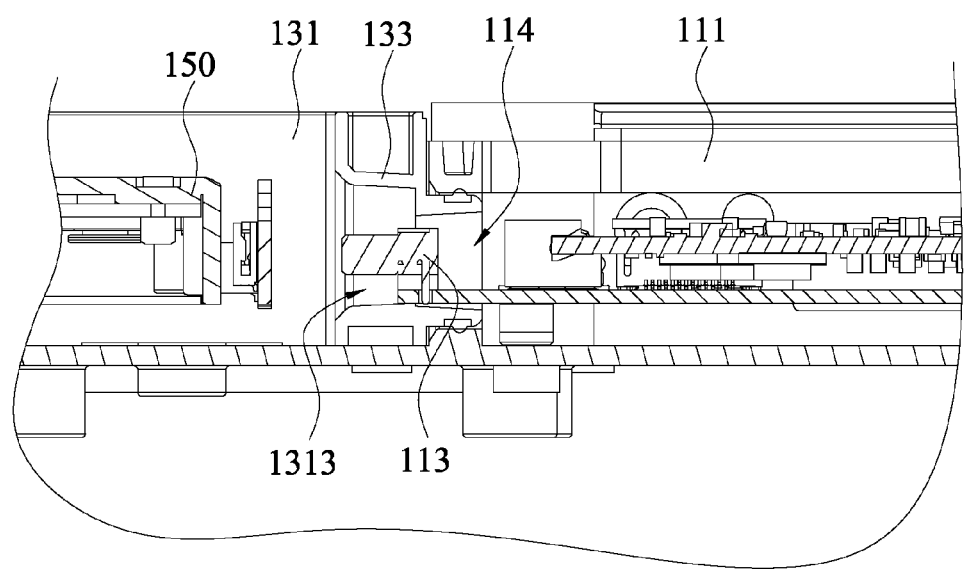
FIG. 4 is a section schematic diagram of assembly of an expansion device according to the first embodiment.

Refer to FIG. 4. FIG. 4 shows a section schematic diagram of assembly of an expansion device according to the first embodiment. In the first embodiment, the casing body 111 includes a connection portion 113, the frame 131 includes an opening portion 1313, and the opening portion 1313 is provided to correspond to the connection portion 113. The expansion device 150 is electrically connected to the connection portion 113 through the opening portion 1313. As shown in FIG. 4, the connection portion 113 is, for example, a connection terminal, and can pass through the opening portion 1313 so as to be electrically connected to a female end of the expansion device 150. Moreover, the expansion device 150 may also have a male connection terminal, the connection portion 113 is a female end, and the connection terminal of the expansion device 150 can pass through the opening portion 1313 so as to be electrically connected to the connection portion 113.

In the first embodiment, as shown in FIG. 2 and FIG. 4, the bracket 131 includes a waterproof member 133, which protrudes from the opening portion 1313. The waterproof member 133 is, for example but not limited to, a hollow protruding member formed on the frame 133 and protruding toward the connection portion 113, or may be an independent element. In the first embodiment, the casing body 111 further includes a connection hole portion 114, the connection portion 113 passes through the connection hole portion 114, and the waterproof member 133 passes through the connection hole portion 114 and envelops the connection portion 113. Thus, a liquid can be prevented from invading the interior of the casing 110 from between the frame 131 and the casing body 111, and the connection between the expansion device 150 and the casing 110 can also be protected.

In the first embodiment, as shown in FIG. 1, the casing 100 with a replacement structure includes a cover plate 170, which is installed on the replacement assembly 130 and covers the accommodating space 132. Thus, the replacement component 130 is protected in the casing 110, and is prevented from external impacts and hence from damage. For better illustration purpose, apart from FIG. 1, the structure of the cover plate 170 is omitted from the remaining drawings.

Figure 5:
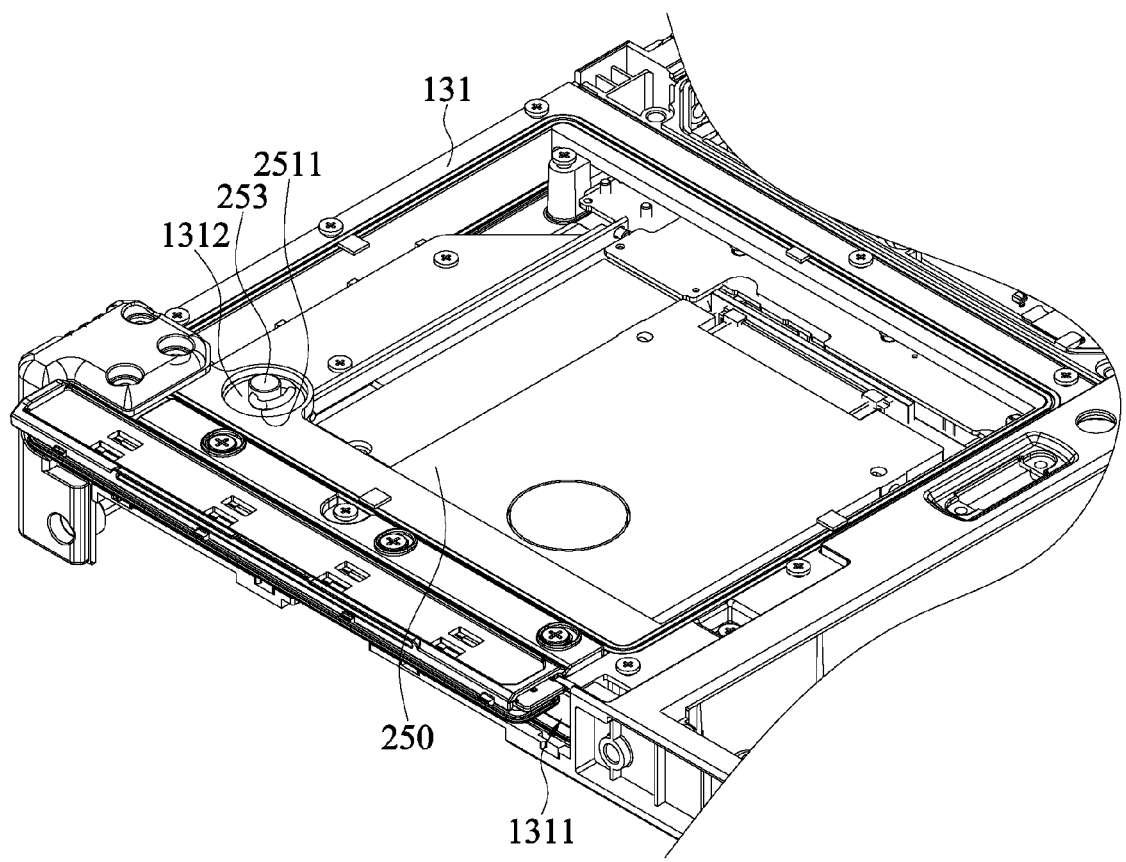
FIG. 5 is a perspective schematic diagram of a replacement assembly according to a second embodiment.

Refer to FIG. 5. FIG. 5 shows a perspective schematic diagram of a replacement assembly according to a second embodiment. Details of structures of the second embodiment the same as those of the first embodiment are omitted herein. In the second embodiment, an expansion device 250 is a hard drive assembly. Similar to the assembly method of the first embodiment, to remove an expansion device 250 from the accommodating space 132, a fixing member 253 is removed from the first hole 1312 and a second hole 2511, such that the fixing relation between the expansion device 250 and the frame 131 is released, thus allowing the expansion device 250 to be taken out of the opening portion 1311.

Figure 6:
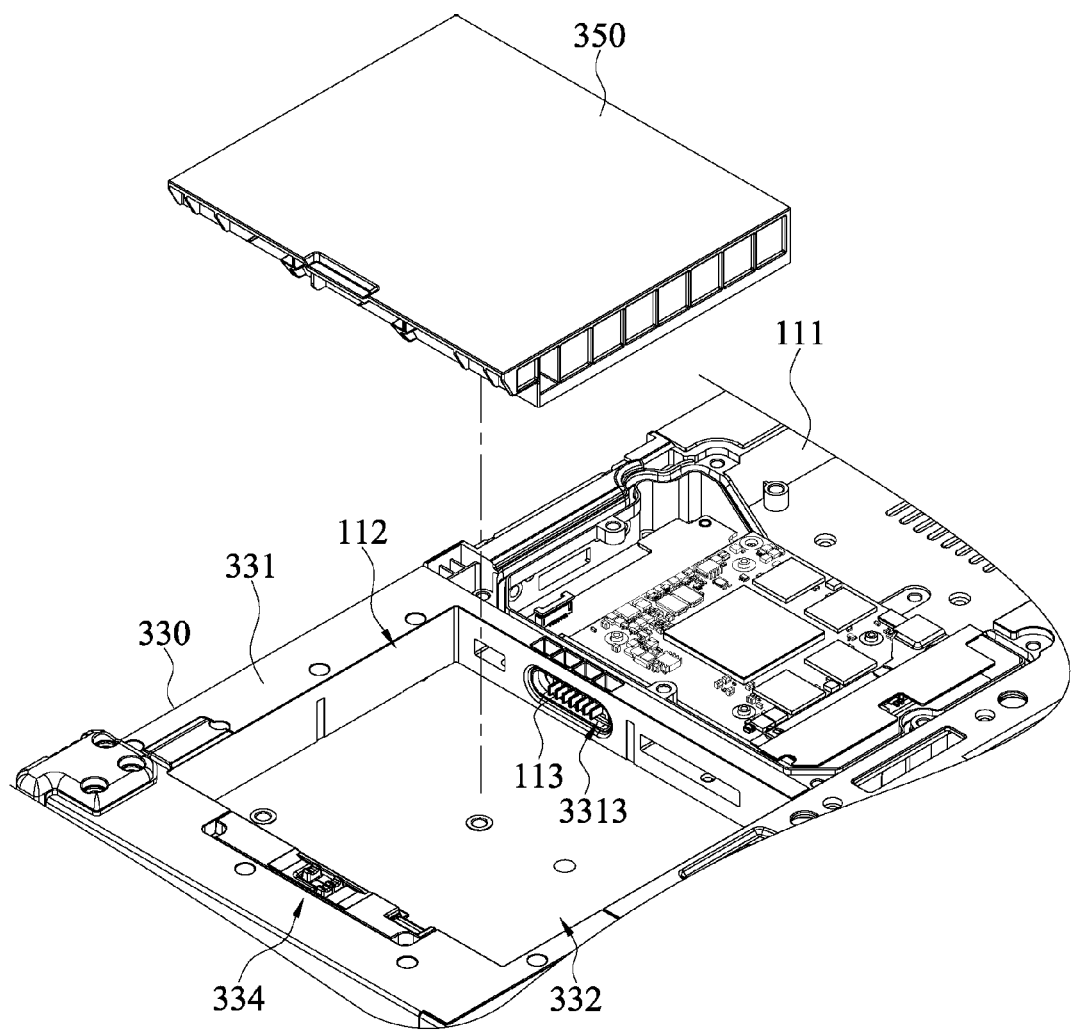
FIG. 6 is an exploded partial perspective diagram of a replacement assembly according to a third embodiment.
Figure 7:
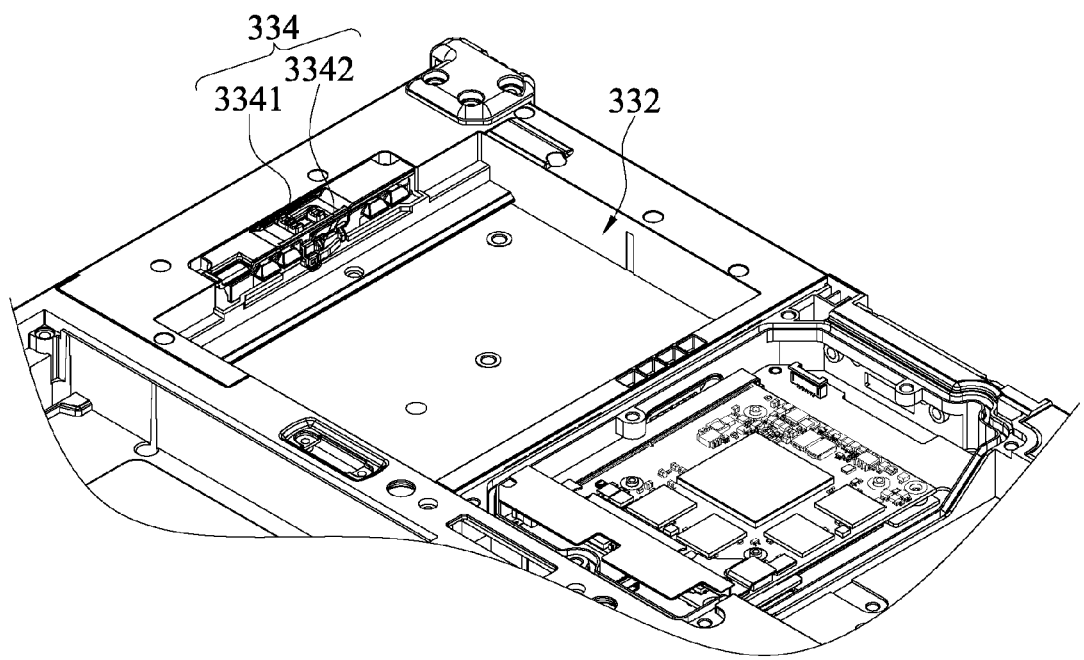
FIG. 7 is a schematic diagram of FIG. 6 from another angle.

Refer to FIG. 6 to FIG. 7. FIG. 6 shows an exploded partial perspective diagram of a replacement assembly according to a third embodiment. FIG. 7 shows a schematic diagram of FIG. 6 from another angle. Details of structures of the third embodiment the same as those of the first embodiment are omitted herein. In the third embodiment, an expansion device 350 is a battery assembly. As shown in FIG. 6, a replacement assembly 330 includes a frame 331, which is installed in the assembly space 112 and encloses with the casing body 111 to form an accommodating space 332. Moreover, a frame 331 is a hollow support. The hollow part is an accommodating space 332. The expansion device 350 can be selectively removed from or installed in the accommodating space 332.

As shown in FIG. 6 and FIG. 7, in the third embodiment, the frame 331 includes a latch assembly 334, which has a toggle lever 3341 and an engagement portion 3342. The toggle lever 3341 is connected to the engagement portion 3342 so as to move the engagement portion 3342 between a lock position and a release position by the toggle lever 3341. To fix the expansion device 350 in the accommodating space 332, the toggle 3341 is toggled to engage and fix the expansion device 350 with the engagement portion 3342. To remove the expansion device 350 from the accommodating space 332, the toggle 3341 is toggled to release the engagement of the expansion device 350 from the engagement portion 3342.

Figure 8:
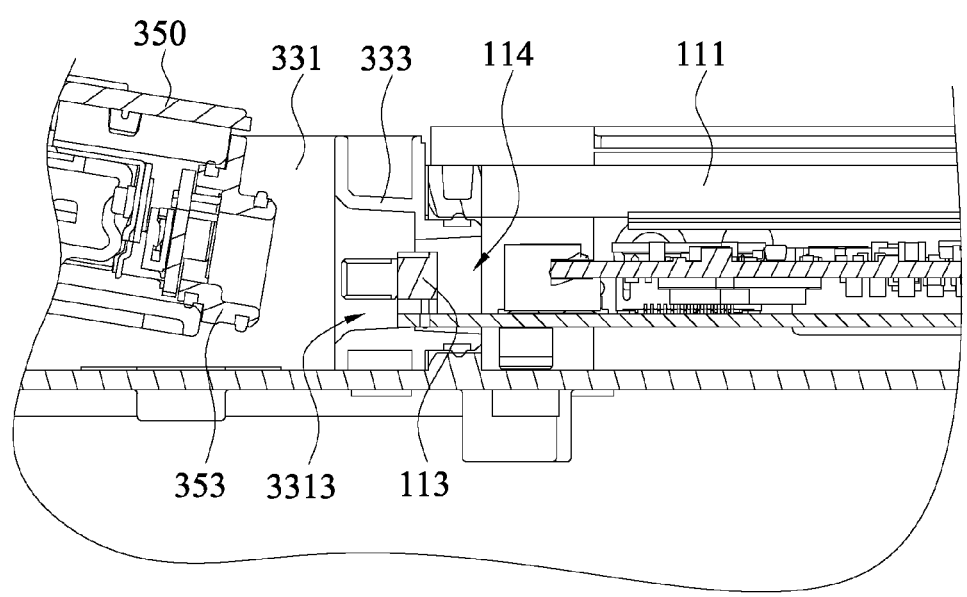
FIG. 8 is a section schematic diagram of an expansion device according to the third embodiment.

Refer to FIG. 8 as well as FIG. 6. FIG. 8 shows a section schematic diagram of an expansion device according to the third embodiment. In the third embodiment, the casing body 111 has a connection portion 113, and the frame 331 has an opening portion 3313, wherein the opening portion 3313 is provided to face the connection portion 113. The expansion device 350 is electrically connected to the connection portion 113 via the opening portion 3313. As shown in FIG. 8, the connection portion 113 is, for example, a connection terminal, and can pass through the opening portion 3313 so as to be electrically connected to a female end of the expansion device 350. Moreover, the expansion device 350 may also have a male connection terminal, the connection portion 113 is a female end, and the connection terminal of the expansion device 350 can pass through the opening portion 3313 so as to be electrically connected to the connection portion 113.

In the third embodiment, as shown in FIG. 6 and FIG. 8, the frame 331 includes a waterproof member 333, which protrudes from the opening portion 3313. The waterproof member 333 is, for example, a hollow protruding member formed on the frame 133 and protruding toward the connection portion 113. In the third embodiment, the casing body 111 further includes a connection hole portion 114, the connection portion 113 passes through the connection hole portion 114, and the waterproof member 333 passes through the connection hole portion 114 and envelops the connection portion 113. Thus, a liquid can be prevented from invading the interior of the casing 110 from between the frame 331 and the casing body 111, and the connection between the expansion device 350 and the casing 110 can also be protected. In the third embodiment, the expansion device 350 further includes a connection member 353, which protrudes from the expansion device 350 so as to pass through the opening portion 3313 and to be electrically connected to the connection portion 113.

In conclusion, a casing with a replacement structure and an electronic device are provided according to the embodiments above. By providing the assembly space for installing the replacement assembly at a vertical intersection of two side edges of the casing body, occupying the space of other peripheral components is avoided. Moreover, by substituting the frame of the replacement assembly for part of the casing body, the material used by the casing body can be reduced, and the casing body is allowed to be more intact as having a reduced number of holes. In addition, because the assembly space is completely exposed and visible, the replacement assembly can be more easily aligned and installed during the assembly process. Moreover, the replacement assembly is selectively removable from the assembly space, further achieving an effect of quick replacement; for example, an optical drive assembly serving as the expansion device can be replaced by a hard drive assembly, or be replaced by a battery assembly. Thus, customers are provided with more diversified function options.

What is claimed is:

1. A casing with a replacement structure, comprising:
the casing, comprising a casing body and an assembly space, the assembly space provided in a recessed manner at the casing body and located at a vertical intersection of two side edges of the casing body; and
a replacement assembly, having a frame, the frame installed in the assembly space and enclosing with the casing body to form an accommodating space;
wherein the replacement assembly comprises an expansion device installed in the accommodating space, the frame comprises a first hole, the expansion device comprises a bracket and an expansion member, the expansion member is installed on the bracket, the bracket comprises a second hole, the first hole corresponds to the second hole, and the frame and the bracket are mutually fixed by a fixing member.

2. The casing with a replacement structure according to claim 1, wherein the frame is installed in the assembly space, and the frame at least substitutes for the two vertically intersecting side edges of the casing.

3. The casing with a replacement structure according to claim 1, wherein the frame has an opening portion, which is provided to face an outer side of the frame.

4. The casing with a replacement structure according to claim 1, wherein the bracket further comprises a lever.

5. The casing with a replacement structure according to claim 1, further comprising:
a cover plate, installed on the replacement assembly and covering the accommodating space.

6. The casing with a replacement structure according to claim 1, wherein the casing body has a connection portion, the frame has an opening portion, the opening portion is provided to face the connection portion, and the expansion device is electrically connected to the connection portion via the opening portion.

7. The casing with a replacement structure according to claim 4, wherein the frame comprises a latch assembly, the latch assembly has a toggle lever and an engagement portion, and the toggle lever is connected to the engagement portion so as to move the engagement portion between a lock position and a release position by the toggle lever.

8. The casing with a replacement structure according to claim 4, further comprising:
a waterproof member, protruding from the opening portion.

9. An electronic device, comprising:
a casing, comprising a casing body and an assembly space, the assembly space provided in a recessed manner at the casing body and located at a vertical intersection of two side edges of the casing body; and
a replacement assembly, having a frame, the frame installed in the assembly space and enclosing with the casing body to form an accommodating space;
wherein the replacement assembly comprises an expansion device installed in the accommodating space, the frame comprises a first hole, the expansion device comprises a bracket and an expansion member, the expansion member is installed on the bracket, the bracket comprises a second hole, the first hole corresponds to the second hole, and the frame and the bracket are mutually fixed by a fixing member.

10. The electronic device according to claim 9, wherein the frame is installed in the assembly space, and the frame at least substitutes for the two vertically intersecting side edges of the casing.

11. The electronic device according to claim 9, wherein the frame has an opening portion, which is provided to face an outer side of the frame body.

12. The electronic device according to claim 9, further comprising:
a cover plate, installed on the replacement assembly and covering the accommodating space.

13. The electronic device according to claim 9, wherein the casing body has a connection portion, the frame has an opening portion, the opening portion is provided to face the connection portion, and the expansion device is electrically connected to the connection portion via the opening portion.

14. The electronic device according to claim 13, further comprising:
a waterproof member, protruding from the opening portion.

15. The electronic device according to claim 13, wherein the frame comprises a latch assembly, the latch assembly has a toggle lever and an engagement portion, and the toggle lever is connected to the engagement portion so as to move the engagement portion between a lock position and a release position by the toggle lever.

16. An electronic device, comprising:
a casing, comprising a casing body and an assembly space, the assembly space provided in a recessed manner on a corner of the casing body; and
a replacement assembly, having a frame and an expansion device, the frame installed in the assembly space and enclosing with the casing body to form an accommodating space, the expansion device installed in the accommodating space;
wherein the replacement assembly comprises an expansion device installed in the accommodating space, the frame comprises a first hole, the expansion device comprises a bracket and an expansion member, the expansion member is installed on the bracket, the bracket comprises a second hole, the first hole corresponds to the second hole, and the frame and the bracket are mutually fixed by a fixing member.

* * * * *